United States Patent [19]

Im

[11] Patent Number: 5,787,100
[45] Date of Patent: Jul. 28, 1998

[54] APPARATUS FOR DETERMINING ERROR EVALUATOR POLYNOMIAL FOR USE IN A REED-SOLOMON DECODER

[75] Inventor: Yong-Hee Im, Seoul, Rep. of Korea

[73] Assignee: Daewoo Electronics Co., Ltd., Seoul, Rep. of Korea

[21] Appl. No.: 810,502

[22] Filed: Feb. 28, 1997

[30] Foreign Application Priority Data

Feb. 28, 1996 [KR] Rep. of Korea ............ 1996 5128
Feb. 29, 1996 [KR] Rep. of Korea ............ 1996 5444

[51] Int. Cl.$^6$ .................................................. H03M 13/00
[52] U.S. Cl. .................................................. 371/37.11
[58] Field of Search ........................................ 371/37.11

[56] References Cited

U.S. PATENT DOCUMENTS

| 4,868,828 | 9/1989 | Shao et al. | 371/5.1 |
| 5,020,060 | 5/1991 | Murai et al. | 371/37.1 |
| 5,517,509 | 5/1996 | Yoneda | 371/37.1 |
| 5,537,426 | 7/1996 | Lee | 371/37.1 |
| 5,642,367 | 6/1997 | Kao | 371/40.1 |

FOREIGN PATENT DOCUMENTS 03190326  8/1991  Japan .

*Primary Examiner*—Stephen M. Baker
*Attorney, Agent, or Firm*—Pennie & Edmonds LLP

[57] ABSTRACT

An apparatus, for use in a Reed-Solomon decoder, calculates coefficients of an error evaluator polynomial, according to $\Omega(X)=1+(S_1+\sigma_1)X+(S_2+S_1\sigma_1+\sigma_3)X^2+ \ldots +(S_T+S_{T-1}\sigma_1+S_{T-2}\sigma_2+\ldots+\sigma_T)X^T$, wherein $S_i$ is an (i)th syndrome value, $\sigma_i$ is an (i)th coefficient of an error locator polynomial, i ranging from 1 to T, T being a predetermined number. The apparatus comprises: a coefficient input block for sequentially providing the coefficients of the error locator polynomial as a first output and the syndrome values as a second output in a predetermined order; a multiplier for sequentially multiplying the first output and the second output provided from the coefficient input block, to thereby sequentially provide multiplication results; T memories; a first multiplexor for providing contents of one of the T memories in a predefined order; an adder for adding each of the multiplication results provided from the multiplier to the contents of one of the T memories provided from the multiplexor, to thereby provide an addition result; a second multiplexor for selectively providing the first output or the addition result; and a demultiplexor for providing the first output or the addition result provided from the second multiplexor to one of the T memories, to be stored therein.

6 Claims, 3 Drawing Sheets

APPARATUS FOR DETERMINING ERROR EVALUATOR POLYNOMIAL FOR USE IN A REED-SOLOMON DECODER

FIELD OF THE INVENTION

The present invention relates to an apparatus for correcting errors present in stored or transmitted data; and, more particularly, to an apparatus for determining coefficients of an error evaluator polynomial which are used in correcting errors in the data encoded by using a Reed-Solomon code.

DESCRIPTION OF THE PRIOR ART

Noises occurring during a process of transmitting, storing or retrieving data can in turn cause errors in the transmitted, stored or retrieved data. Accordingly, various encoding techniques, having the capability of rectifying such errors, for encoding the data to be transmitted or stored have been developed.

In such encoding techniques, a set of check bits is appended to a group of message or information bits to form a codeword. The check bits, which are determined by an encoder, are used to detect and correct the errors. In this regard, the encoder essentially treats the bits comprising the message bits as coefficients of a binary message polynomial and derives the check bits by multiplying the message polynomial $i(X)$ with a code generating polynomial $g(X)$ or dividing $i(X)$ by $g(x)$, to thereby provide a codeword polynomial $c(X)$. The code generating polynomial is selected to impart desired properties to a codeword upon which it operates so that the codeword will belong to a particular class of error-correcting binary group codes (see, e.g., S. Lin et al., "Error Control Coding: Fundamentals and Applications", Prentice-Hall, 1983).

One class of error correcting codes is the well-known BCH (Bose-Chaudhuri-Hocquenghen) code class, which includes the Reed-Solomon ("RS") code. The mathematical basis of the RS code is explained in, e.g., the aforementioned reference by Lin et al. and also in Berlekamp, "Algebraic Coding Theory", McGraw-Hill, 1968, which is further referred to in U.S. Pat. No. 4,162,480 issued to Berlekamp.

If roots of the code generating polynomial $g(X)$ of the RS code are 2T consecutive powers of $\alpha$ as in Eq. (1), as many as T errors can be corrected:

$$g(X) = \prod_{i=1}^{2T} (X - \alpha^i) \quad \text{Eq. (1)}$$

wherein $\alpha$ is a primitive element in a finite field $GF(2^m)$.

In the process of receiving or retrieving a transmitted or stored codeword, certain attendant noises may have been converted to an error pattern in the codeword. In order to deal with the error pattern imposed upon the RS code, a four step procedure is generally utilized. In discussing the error-correcting procedure, reference shall be made to a RS code consisting of codewords containing N M-bit symbols (of which K symbols are informational symbols and (N−K) symbols are check symbols). In that case, $c(X)$ becomes an (N−1)st order polynomial and 2T equals (N−K). As a first error correcting step, syndromes $S_0, S_1, \ldots, S_{2T-1}$ are calculated from a received codeword polynomial $r(X)$, i.e., an (N−1)st order polynomial representing the received codeword. The received codeword polynomial $r(X)$ is represented as $r_{N-1}X^{N-1} + r_{N-2}X^{N-2} + \ldots + r_1X^1 + r_0$, wherein $r_j$ is an (N−j)th symbol of a codeword. As a second step, using the syndromes, coefficients of an error locator polynomial $\sigma(X)$ are calculated. In a third step, the error locator polynomial $\sigma(X)$ is solved to obtain its roots, which represent the error locations in the received codewords. Specifically, if substituting a power of the primary element, $\alpha^{-j}$, for a variable X in the error locator polynomial $\sigma(X)$ results in 0 (i.e., $\alpha^{-j}$ becomes a root of $\sigma(X)$), it means that an error has occurred in $r_j$, i.e., a (N−j)th symbol of a codeword.

As a fourth step, error values are calculated by using the error locations and the syndromes. Mathematical expressions for the syndromes and the coefficients of the error locator polynomial are set forth in the afore-referenced U.S. Pat. No. 4,162,480 issued to Berlekamp.

The fourth step will be now explained in more detail.

First, an error evaluator polynomial $\Omega(X)$ may be obtained as follows:

$$\Omega(X) = \sigma(X)S(X) \quad \text{Eq. (2)}$$

wherein $S(X)$ is a syndrome polynomial whose coefficients are the syndromes.

After deriving the error evaluation polynomial $\Omega(X)$, an error value $e_j$ may be calculated as $$e_j = \alpha^j \frac{\Omega(\alpha^{-j})}{\sigma'(\alpha^{-j})} \quad \text{Eq. (3)}$$

wherein $\sigma'(X)$ is the first derivative of the error locator polynomial $\sigma(X)$; $\alpha^{-j}$ is the root of the error locator polynomial obtained in the third step; and the error value $e_j$ corresponds to the (N−j)th symbol which is an error location obtained in the third step.

After finding the error values, the original codeword can be recovered by adding the error values to the corresponding symbols.

In case that erasures are available, Eq. (2) may be restated as:

$$\Omega(X) = 1 + \Omega_1 X + \Omega_2 X^2 + \Omega_3 X^3 + \ldots + \Omega_T X^T = \quad \text{Eq. (4)}$$

$$1 + (S_1 + \sigma_1)X + (S_2 + S_1\sigma_1 + \sigma_2)X^2 + \ldots +$$

$$(S_T + S_{T-1}\sigma_1 + S_{T-2}\sigma_2 + \ldots + \sigma_T)X^T$$

Referring to FIG. 1, there is shown a block diagram of a conventional error evaluator polynomial calculating apparatus 1 which determines the coefficients of the error evaluator polynomial according to Eq. (4) in case T=4.

The apparatus 1 includes 5 error evaluator polynomial calculating cells (21 to 25), each of which includes a syndrome register (SRi), a coefficient register (CRi), a Galois field ("GF") multiplier and a Galois field adder. The syndrome registers SR1 to SR5 are serially connected so that the syndrome values stored therein may be shifted right. To each of the multipliers 41 to 45, coefficients of the error locator polynomial, $\sigma_i$'s, are provided sequentially.

Before the operation for calculating the error evaluator polynomial starts, the syndrome registers SR1 to SR5 are initialized with syndrome values $S_0$ to $S_4$, respectively, and the coefficient registers CR1 to CR5 are initialized with 0's.

After the initialization, a first step of the error evaluator polynomial calculating procedure follows. Specifically, $\sigma_0$, whose value is 1, is fed to each multiplier and multiplied with $S_0$ to $S_4$ provided from SR1 to SR5 at the multipliers 41 to 45, respectively. The multiplication result, $S_{i-1}$, i being 1 to 5, provided from the multiplier (4i) is applied to the adder (6i). At the adder (6i), the multiplication result is added to the content, i.e., 0, of the coefficient register CRi and the addition result, $S_{i-1}$, is fed back to the CRi.

At a second step of the error evaluator polynomial calculating procedure, each of the syndrome values stored at the syndrome registers is shifted right. $S_4$ stored at SR5 is shifted out and 0 is fed to SR1. Then, $\sigma_1$ is fed to each multiplier 4i and multiplied with 0, $S_0$, $S_1$, $S_2$, and $S_3$ provided from SR1 to SR5, respectively. Each of the multiplication results, i.e., 0, $\sigma_1 S_0$, $\sigma_1 S_1$, $\sigma_1 S_2$, and $\sigma_1 S_3$, is added with the contents of the corresponding coefficient register CRi, and each of the addition results, $S_0$, $S_1+\sigma_1 S_0$, $S_2+\sigma_1 S_1$, $S_3+\sigma_1 S_2$, and $S_4+\sigma_1 S_3$, is fed back to the CRi.

In a similar manner, the contents of SRi's and CRi's are updated as shown in Tables 1 and 2. In the Tables, a first column represents a step number, wherein each step may correspond to one system clock cycle. It should be noted that $S_0$ equals 1 and, therefore, replaced as 1 in the Tables.

TABLE 1

|   | SR1 | SR2 | SR3 | SR4 | SR5 |
|---|---|---|---|---|---|
| 1 | 1 | $S_1$ | $S_2$ | $S_3$ | $S_4$ |
| 2 | 0 | 1 | $S_1$ | $S_2$ | $S_3$ |
| 3 | 0 | 0 | 1 | $S_1$ | $S_2$ |
| 4 | 0 | 0 | 0 | 1 | $S_1$ |
| 5 | 0 | 0 | 0 | 0 | 1 |

TABLE 2

|   | CR1 | CR2 | CR3 | CR4 | CR5 |
|---|---|---|---|---|---|
| 1 | 1 | $S_1$ | $S_2$ | $S_3$ | $S_4$ |
| 2 | 1 | $\sigma_1 + S_1$ | $S_2 + \sigma_1 S_1$ | $S_3 + \sigma_1 S_2$ | $S_4 + \sigma_1 S_3$ |
| 3 | 1 | $\sigma_1 + S_1$ | $S_2 + \sigma_1 S_1 + \sigma_2$ | $S_3 + \sigma_1 S_2 + \sigma_2 S_1$ | $S_4 + \sigma_1 S_3 + \sigma_2 S_2$ |
| 4 | 1 | $\sigma_1 + S_1$ | $S_2 + \sigma_1 S_1 + \sigma_2$ | $S_3 + \sigma_1 S_2 + \sigma_2 S_1 + \sigma_3$ | $S_4 + \sigma_1 S_3 + \sigma_2 S_2 + \sigma_3 S_1$ |
| 5 | 1 | $\sigma_1 + S_1$ | $S_2 + \sigma_1 S_1 + \sigma_2$ | $S_3 + \sigma_1 S_2 + \sigma_2 S_1 + \sigma_3$ | $S_4 + \sigma_1 S_3 + \sigma_2 S_2 + \sigma_3 S_1 + \sigma_4$ |

In accordance with the conventional error evaluator polynomial calculating apparatus 1 explained above, as many as (T+1) error evaluator polynomial calculating cells are needed to obtain the error evaluator polynomial of an order T. Accordingly, (T+1) Galois field adders and (T+1) Galois field multipliers are included at the error evaluator polynomial calculating apparatus 1, which makes the structure of the apparatus complicated and, in turn, an implementation to VLSI (Very Large Scale Integrated circuit) difficult.

SUMMARY OF THE INVENTION

It is, therefore, a primary object of the present invention to provide an error evaluator polynomial calculating apparatus which is constructed with a reduced number of GF multipliers and adders, thereby achieving a reduction in the manufacturing cost or complexity of the apparatus.

In accordance with the present invention, there is provided an apparatus, for use in a Reed-Solomon decoder, for calculating coefficients of an error evaluator polynomial, according to $$\Omega(X)=1+(S_1+\sigma_1)X+(S_2+S_1\sigma_1+\sigma_2)X^2+ \ldots +(S_T S_{T-1}\sigma_1+S_{T-2}\sigma_2+ \ldots +\sigma_T)X^T$$

wherein $S_i$ is an (i)th syndrome value, and $\sigma_i$ is an (i)th coefficient of an error locator polynomial, the apparatus comprising:

a coefficient input block for sequentially providing the coefficients of the error locator polynomial as a first output and the syndrome values as a second output in a predetermined order;

a multiplier for sequentially multiplying the first output and the second output provided from the coefficient input block, to thereby sequentially provide multiplication results;

T memories;

a first multiplexor for providing contents of one of the T memories in a predefined order;

an adder for adding each of the multiplication results provided from the multiplier to the contents of one of the T memories provided from the multiplexor, to thereby provide an addition result;

a second multiplexor for selectively providing the first output or the addition result; and a demultiplexor for providing the first output or the addition result provided from the second multiplexor to one of the T memories, to be stored therein.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 2:
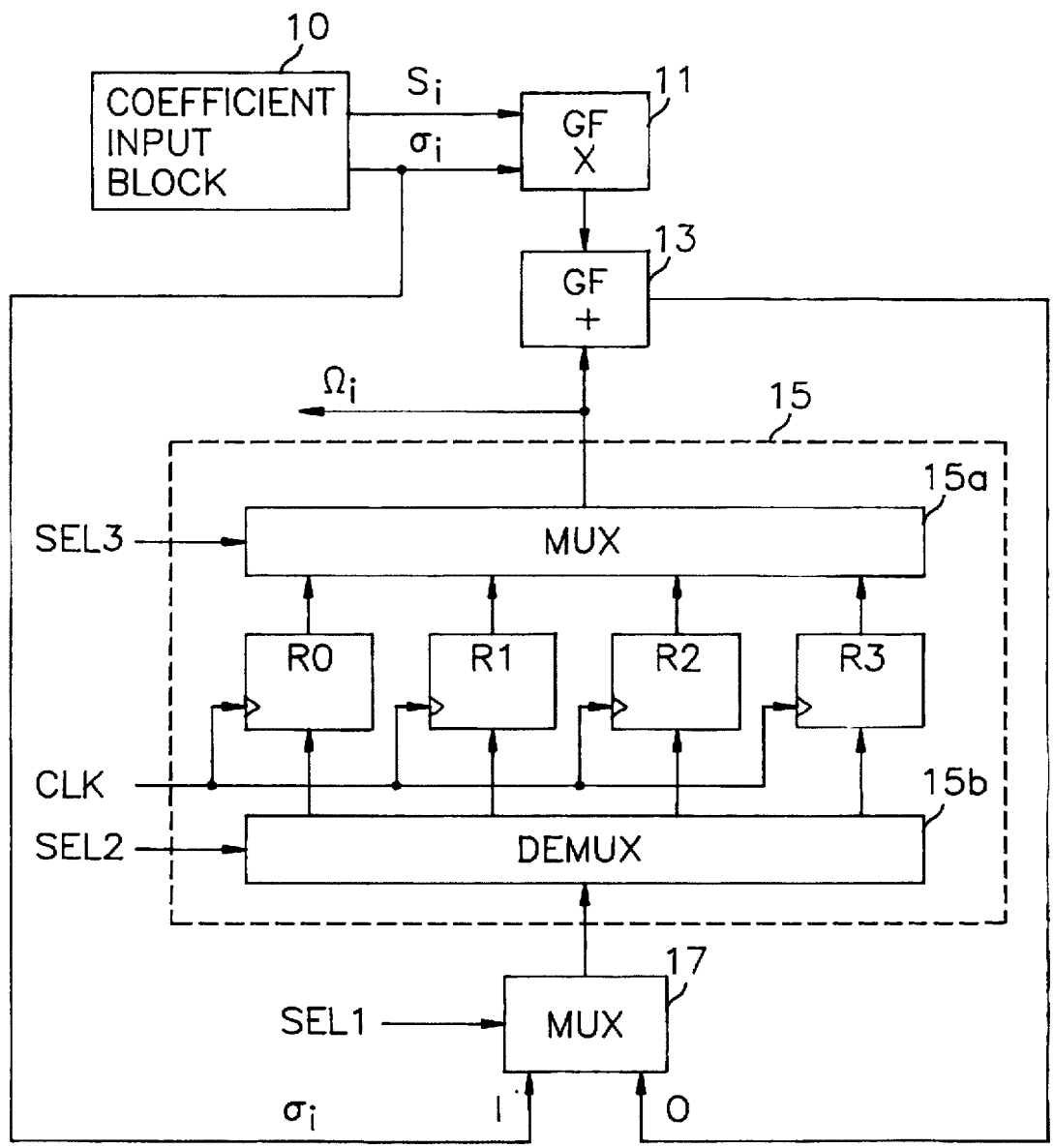
FIG. 2 represents a block diagram of an error evaluator polynomial calculating apparatus in accordance with a first embodiment of the present invention.

Referring to FIG. 2, there is provided a block diagram of an error evaluator polynomial calculating apparatus 2 in accordance with a first embodiment of the present invention. Unlike the conventional apparatus, the error evaluator polynomial calculating apparatus 2, shown in FIG. 2, which is capable of determining (T) coefficients simultaneously, does not include (T+1) cells. In the illustrative embodiments shown in FIGS. 2 and 3, T is set to 4 for the purpose of simplicity.

Figure 1:
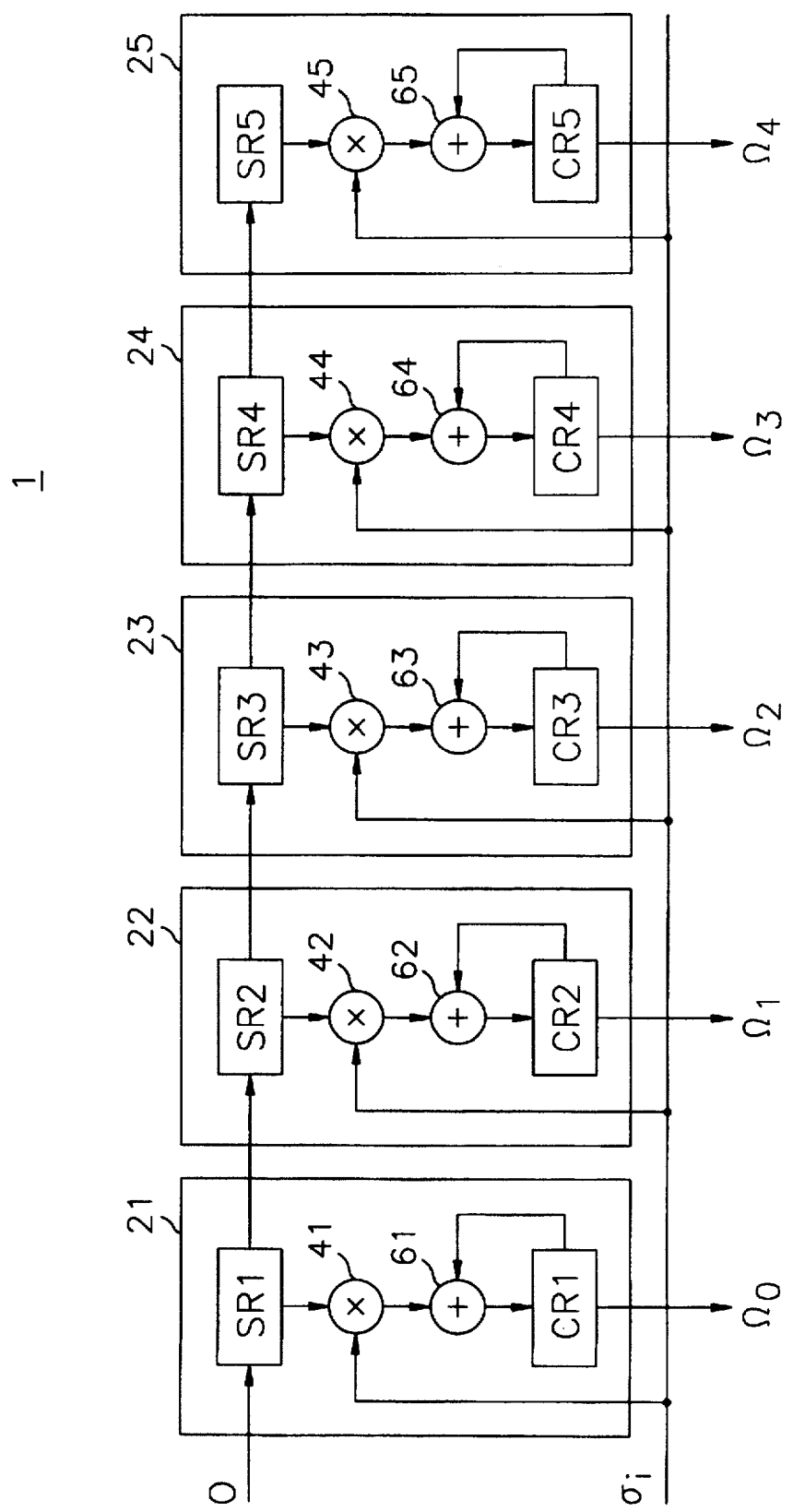
FIG. 1 shows a block diagram of a conventional error evaluator polynomial calculating apparatus.

The error evaluator polynomial calculating apparatus 2 includes a GF multiplier 11 and a GF adder 13 which directly correspond to the GF multipliers 41 to 45 and the GF adders 61 to 65 shown in FIG. 1, respectively. It further includes a register block 15 which corresponds to the registers CR1 to CR5 shown in FIG. 1; a coefficient input block 10 which provides coefficients of the syndrome and the error locator polynomial to the GF multiplier 11 in a predetermined order; and a multiplexor ("MUX") 17 which selectively provides the coefficients of the error locator polynomial supplied from the coefficient input block 10 or an output of the adder 13 to a demultiplexor ("DEMUX") 15b included in the register block 15 in response to a selection signal SELL. SELL controls the MUX 17 to select the output of the coefficient input block 10 on an input port 1 for the 0th iteration, and to select the output of the GF adder 13 on an input port 0 for all the iterations except the 0th iteration. The register block 15 includes 4 registers (R0 to R3) which are connected in parallel, and a MUX 15a and the DEMUX 15b which control the output from and input to the registers, respectively. Edge triggered D flip-flops may be used as the registers. Unlike the conventional apparatus, only first to fourth coefficients, $\Omega_1$ to $\Omega_4$, of the error evaluator polynomial are calculated in the apparatus 2, wherein each of the coefficients are provided from each of the registers R0 to R3 after the operation for calculating the coefficients is completed. 0th coefficient $\Omega_0$ is not calculated at the apparatus 2, for its value is known as 1.

The operation of the apparatus 2 shown in FIG. 2, will be explained in detail.

During a first step of the calculating procedure, the registers R0 to R3 are initialized with the coefficients of the error locator polynomial $\sigma_1$ to $\sigma_4$, respectively. To achieve this, the coefficient input block 10 sequentially provides $\sigma_1$ to $\sigma_4$ as a first output value, i.e. $\sigma_i$, to the MUX 17; and the MUX 17 provides the coefficients to the DEMUX 15b in response to SELL. OR the MUX 17 selects the coefficients of the error locator polynomial supplied from the coefficient input block 10 in case SELL is in a high state; and provides the output of the adder 13 in case SELL is in a low state, to thereby sequentially provide the selected inputs to the DEMUX 15b. The DEMUX 15b provides each of the coefficients, to a corresponding register in response to a control signal SEL2. SEL2 designates one of the 4 registers for each bit clock cycle. Specifically, the DEMUX 15b provides $\sigma_1$ to R0 to be stored therein; $\sigma_2$ to R1; $\sigma_3$ to R2; and $\sigma_4$ to R3. The DEMUX 15b may provide the coefficients to the registers in such a manner that each coefficient is clocked into a corresponding register at a rising edge of a system clock signal which is represented as CLK in FIG. 2. While the registers are initialized with coefficients of the error locator polynomial, a second output of the coefficient input block 10, i.e., $S_j$, may be in a "don't care" state, which means that $S_j$ does not affect the initialization procedure.

After the registers are initialized with $\sigma_1$ to $\sigma_4$, the coefficient input block 10 provides $\sigma_0$, i.e., 1, as the first output $\sigma_i$ and $S_1$ as the second output $S_j$, shown in FIG. 2, to the GF multiplier 11 wherein they are multiplied to provide $\sigma_0 S_1$, i.e., $S_1$, to the GF adder 13. Concurrently, the content of R0, $\sigma_1$, is also provided through the MUX 15a to the GF adder 13 in response to a control signal SEL3. SEL3 controls the MUX 15a to provide $\Omega_i$ in a timely manner. The GF adder 13 adds $S_1$ and $\sigma_1$ and provides an addition result, $S_1+\sigma_1$, to the MUX 17. At this time, the MUX 17 selects the addition result and provides it to the DEMUX 15b in response to SEL1. The DEMUX 15b provides $S_1+\sigma_1$ back to R0, to be stored therein in response to SEL2.

The contents of R1 is updated in a similar manner. Specifically, the coefficients input block provides $\sigma_0$, i.e., 1, and $S_2$ to the multiplier 11, to be multiplied therein. The GF multiplier 11 provides $S_2$ to the GF adder 13. At the GF adder 13, $S_2$ is added to $\sigma_2$ provided from R1 through the MUX 15a in response to SEL3, to thereby provide $S_2+\sigma_2$ to the DEMUX 15b through MUX 17. Then, $S_2+\sigma_2$ is clocked into R1. In this manner, the contents of the registers are sequentially updated as given in Table 3. First two columns of Table 3 represent outputs $\sigma_i$ and $S_j$ of the input coefficient block 10, and contents of third to sixth columns in each row represent contents of each register after the register is updated by using the output of the coefficient input block 10 specified in the row.

TABLE 3

| $\sigma_i$ | $S_j$ | R0 | R1 | R2 | R3 |
|---|---|---|---|---|---|
| $\sigma_0$ | $S_1$ | $S_1 + \sigma_1$ | $\sigma_2$ | $\sigma_3$ | $\sigma_4$ |
| $\sigma_0$ | $S_2$ | $S_1 + \sigma_1$ | $S_2 + \sigma_2$ | $\sigma_3$ | $\sigma_4$ |
| $\sigma_0$ | $S_3$ | $S_1 + \sigma_1$ | $S_2 + \sigma_2$ | $S_3 + \sigma_3$ | $\sigma_4$ |
| $\sigma_0$ | $S_4$ | $S_1 + \sigma_1$ | $S_2 + \sigma_2$ | $S_3 + \sigma_3$ | $S_4 + \sigma_4$ |

It may take 4 system clock cycles for updating the 4 registers as explained above. In Table 3, it can be known that the content of R0 equals $\Omega_1$ and, therefore, need not be updated any more.

Therefore, during a next stage of the operation, three registers R1 to R3 are updated. To do this, the coefficient input block 10 provides $\sigma_1$ as $\sigma_i$ and also sequentially supplies $S_1$, $S_2$, and $S_3$ to the multiplier 11. In response to these inputs, the GF multiplier 11 sequentially provides $\sigma_1 S_1$, $\sigma_1 S_2$, and $\sigma_1 S_3$ to the GF adder 13. At the GF adder 13, $\sigma_1 S_1$, $\sigma_1 S_2$, and $\sigma_1 S_3$ are added to the contents of the registers R1 to R3 provided through MUX 15a in reponse to SEL3, respectively, to thereby provide the addition results back to R1 to R3. At the end of this stage of operation the content of R1 becomes $\Omega_2$ and no futher updating for R1 is needed. Then, in a similar manner R2 and R3 are futher updated with $\sigma_2$ provided as $\sigma i$ and sequentially provided $S_1$, $S_2$ as $S_j$ and then, finally, R3 is updated with $\sigma_3$ as $\sigma_i$ and $S_1$ as $S_j$ as specified in Table 4, so that each register may provide a corresponding coefficient of the error evaluator polynomial at the end of the operation. That is, $\Omega_1$ is stored in R0, $\Omega_2$ in R1, $\Omega_3$ in R2, and $\Omega_4$ in R3.

TABLE 4

| $\sigma_i$ | $S_j$ | R0 | R1 | R2 | R3 |
|---|---|---|---|---|---|
| $\sigma_1$ | $S_1$ | $S_1 + \sigma_1$ | $S_2 + S_1\sigma_1 + \sigma_2$ | $S_3 + \sigma_3$ | $S_4 + \sigma_4$ |
| $\sigma_1$ | $S_2$ | $S_1 + \sigma_1$ | $S_2 + S_1\sigma_1 + \sigma_2$ | $S_3 + S_2\sigma_1 + \sigma_3$ | $S_4 + \sigma_4$ |
| $\sigma_1$ | $S_3$ | $S_1 + \sigma_1$ | $S_2 + S_1\sigma_1 + \sigma_2$ | $S_3 + S_2\sigma_1 + \sigma_3$ | $S_4 + S_3\sigma_1 + \sigma_4$ |
| $\sigma_2$ | $S_1$ | $S_1 + \sigma_1$ | $S_2 + S_1\sigma_1 + \sigma_2$ | $S_3 + S_2\sigma_1 + S_1\sigma_2 + \sigma_3$ | $S_4 + S_3\sigma_1 + \sigma_4$ |
| $\sigma_2$ | $S_2$ | $S_1 + \sigma_1$ | $S_2 + S_1\sigma_1 + \sigma_2$ | $S_3 + S_2\sigma_1 + S_1\sigma_2 + \sigma_3$ | $S_4 + S_3\sigma_1 + S_2\sigma_2 + \sigma_4$ |
| $\sigma_3$ | $S_1$ | $S_1 + \sigma_1$ | $S_2 + S_1\sigma_1 + \sigma_2$ | $S_3 + S_2\sigma_1 + S_1\sigma_2 + \sigma_3$ | $S_4 + S_3\sigma_1 + S_2\sigma_2 + S_1\sigma_3 + \sigma_4$ |

After each coefficient of the error evaluator polynomial ($\Omega_k$) is stored at the corresponding register, it is sequentially provided therefrom, to be used in other parts of the Reed-Solomon decoder (not shown). As explained above, the error evaluator polynomial calculating apparatus 2 in accordance with a first embodiment of the present invention provides coefficients of the error evaluator polynomial.

Figure 3:
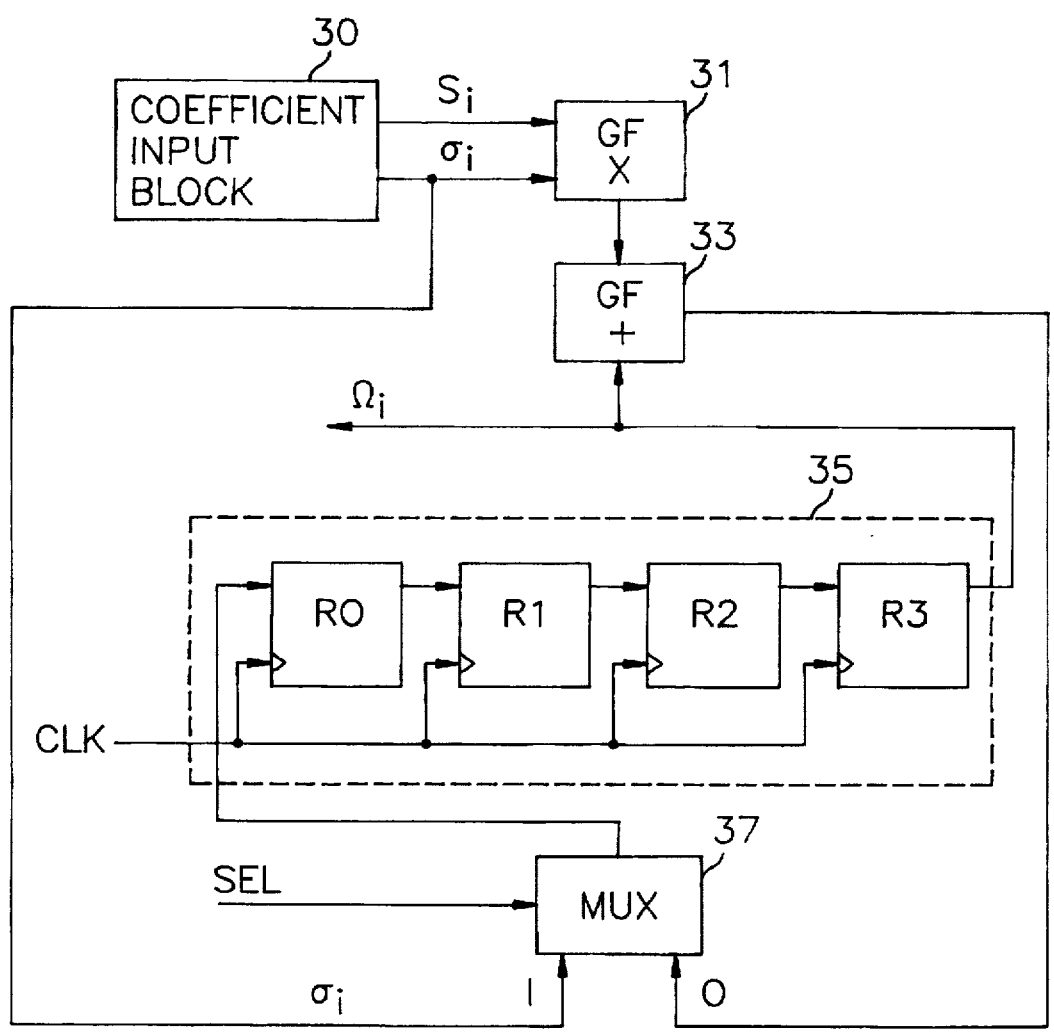
FIG. 3 illustrates a block diagram of an error evaluator polynomial calculating apparatus in accordance with a second embodiment of the present invention.

Referring to FIG. 3, there is provided a block diagram of an error evaluator polynomial calculating apparatus 3 in accordance with a second embodiment of the present invention.

The structure of the error evaluator polynomial calculating apparatus 3 shown in FIG. 3 is substantially same as that of FIG. 2. However, unlike the apparatus 2 shown in FIG. 2, the register block 35 includes 4 registers (R0 to R3) connected in serial. The apparatus 3 shown in FIG. 3 also provides first to fourth coefficients, $\Omega_1$ to $\Omega_4$, of the error evaluator polynomial.

During a first step of the calculating procedure, the registers R0 to R3 are initialized with the coefficients of the error locator polynomial $\sigma_4$ to $\sigma_1$, respectively. To achieve this, a coefficient input block 30 sequentially provides $\sigma_1$ to $\sigma_4$ as a first output, i.e., $\sigma_i$, to a MUX 37; and the MUX 37 sequentially provides the coefficients to R0 in response to a control signal SEL. SEL controls the MUX 37 to select the output of the coefficient input block 30 on an input port 1 during the initialization, and to select the output of the GF adder 33 on an input port 0 otherwise. The contents of the registers are shifted right so that R0 to R3 store $\sigma_4$ to $\sigma_1$, respectively.

After the registers are initialized with $\sigma_4$ to $\sigma_1$, the coefficient input block 30 provides $\sigma_0$, i.e., 1, as the first output, $\sigma_i$, and $S_1$ as the second output, $S_j$, to the GF multiplier 31 wherein they are multiplied to provide $\sigma_0 S_1$, i.e., $S_1$, to the GF adder 33. Concurrently, the content of R3, $\sigma_1$ is also provided to the GF adder 33. The GF adder 33 provides an addition result, $S_1+\sigma_1$ to the MUX 37. At this time, the MUX 37 selects the addition result in response to SEL and provides it to R0, to be stored therein, and the contents of registers are shifted right. As a result, the contents of R0 to R3 become $S_1+\sigma_1$, $\sigma_4$, $\sigma_3$ and $\sigma_2$, respectively.

Then, the coefficients input block 30 provides $\sigma_0$, i.e., 1, and $S_2$ to the multiplier 31, to be multiplied therein. The GF multiplier 31 provides $S_2$ to the GF adder 33. At the GF adder 33, $S_2$ is added to $\sigma_2$ provided from R3, to thereby provide $S_2+\sigma_2$ to R0, to be stored therein. In this manner, the contents of the registers are sequentially updated as given in Table 5, wherein first two columns represent outputs $\sigma_i$ and $S_j$ of the input coefficient block 30, and contents of third to sixth columns in each row represent contents of each register after the register is updated by using the output of the coefficient input block 30 specified in the row.

It should be noted that access to the registers, R0 to R3, can only be possible in a circular shift manner. Therefore, the updating of the registers cannot be done in an arbitrary order. To conform to this, the coefficient input block 30 provides $\sigma_i$ and $S_j$ as specified in Table 5. That is, in case a register need not be updated, the coefficient input block 30 provides 0, as shown in the second column in Table 5 so that 0 is added to the contents of the register.

As shown in Table 5, at the end of the operation, $\Omega_1$ is stored in R3, $\Omega_2$ in R2, $\Omega_3$ in R1, and $\Omega_4$ in R0. They are sequentially provided therefrom, to be used in other parts of the Reed-Solomon decoder (not shown).

Although the operation of the apparatus of the present invention is illustrated for the specified sequence of the output of the coefficient input block 10 or 30, other sequence other than the one used herein can be utilized to calculate the coefficients of the error evaluator polynomial.

TABLE 5

| $\sigma_i$ | $S_i$ | R0 | R1 | R2 | R3 |
|---|---|---|---|---|---|
| $\sigma_0$ | $S_1$ | $S_1 + \sigma_1$ | $\sigma_4$ | $\sigma_3$ | $\sigma_2$ |
| $\sigma_0$ | $S_2$ | $S_2 + \sigma_2$ | $S_1 + \sigma_1$ | $\sigma_4$ | $\sigma_3$ |
| $\sigma_0$ | $S_3$ | $S_3 + \sigma_3$ | $S_2 + \sigma_2$ | $S_1 + \sigma_1$ | $\sigma_4$ |
| $\sigma_0$ | $S_4$ | $S_4 + \sigma_4$ | $S_3 + \sigma_3$ | $S_2 + \sigma_2$ | $S_1 + \sigma_1$ |
| $\sigma_1$ | 0 | $S_1 + \sigma_1$ | $S_4 + \sigma_4$ | $S_3 + \sigma_3$ | $S_2 + \sigma_2$ |
| $\sigma_1$ | $S_1$ | $S_2 + S_1\sigma_1 + \sigma_2$ | $S_1 + \sigma_1$ | $S_4 + \sigma_4$ | $S_3 + \sigma_3$ |
| $\sigma_1$ | $S_2$ | $S_3 + S_2\sigma_1 + \sigma_3$ | $S_2 + S_1\sigma_1 + \sigma_2$ | $S_1 + \sigma_1$ | $S_4 + \sigma_4$ |
| $\sigma_1$ | $S_3$ | $S_4 + S_3\sigma_1 + \sigma_4$ | $S_3 + S_2\sigma_1 + \sigma_3$ | $S_2 + S_1\sigma_1 + \sigma_2$ | $S_1 + \sigma_1$ |
| $\sigma_2$ | 0 | $S_1 + \sigma_1$ | $S_4 + S_3\sigma_1 + \sigma_4$ | $S_3 + S_2\sigma_1 + \sigma_3$ | $S_2 + S_1\sigma_1 + \sigma_2$ |
| $\sigma_2$ | 0 | $S_2 + S_1\sigma_1 + \sigma_2$ | $S_1 + \sigma_1$ | $S_4 + S_3\sigma_1 + \sigma_4$ | $S_3 + S_2\sigma_1 + \sigma_3$ |
| $\sigma_2$ | $S_1$ | $S_3 + S_2\sigma_1 + S_1\sigma_2 + \sigma_3$ | $S_2 + S_1\sigma_1 + \sigma_2$ | $S_1 + \sigma_1$ | $S_4 + S_3\sigma_1 + \sigma_4$ |
| $\sigma_2$ | $S_2$ | $S_4 + S_3\sigma_1 + S_2\sigma_2 + \sigma_4$ | $S_3 + S_2\sigma_1 + S_1\sigma_2 + \sigma_3$ | $S_2 + S_1\sigma_1 + \sigma_2$ | $S_1 + \sigma_1$ |
| $\sigma_3$ | 0 | $S_1 + \sigma_1$ | $S_4 + S_3\sigma_1 + S_2\sigma_2 + \sigma_4$ | $S_3 + S_2\sigma_1 + S_1\sigma_2 + \sigma_3$ | $S_2 + S_1\sigma_1 + \sigma_2$ |
| $\sigma_3$ | 0 | $S_2 + S_1\sigma_1 + \sigma_2$ | $S_1 + \sigma_1$ | $S_4 + S_3\sigma_1 + S_2\sigma_2 + \sigma_4$ | $S_3 + S_2\sigma_1 + S_1\sigma_2 + \sigma_3$ |
| $\sigma_3$ | 0 | $S_3 + S_2\sigma_1 + S_1\sigma_2 + \sigma_3$ | $S_2 + S_1\sigma_1 + \sigma_2$ | $S_1 + \sigma_1$ | $S_4 + S_3\sigma_1 + S_2\sigma_2 + \sigma_4$ |
| $\sigma_3$ | $S_1$ | $S_4 + S_3\sigma_1 + S_2\sigma_2 + S_1\sigma_3 + \sigma_4$ | $S_3 + S_2\sigma_1 + S_1\sigma_2 + \sigma_3$ | $S_2 + S_1\sigma_1 + \sigma_2$ | $S_1 + \sigma_1$ |

While the present invention has been described with respect to the particular embodiments, it will be apparent to those skilled in the art that various changes and modifications may be made without departing from the spirit and scope of the invention as defined in the following claims.

What is claimed is:

1. An apparatus, for use in a Reed-Solomon decoder, for calculating coefficients of an error evaluator polynomial $\Omega(X)$, according to $$\Omega(X)=1+\Omega_1 X+\Omega_2 X^2+\Omega_3 X^3+\ldots+\Omega_T X^T=1+(S_1+\sigma_1)X+(S_2+S_1\sigma_1+\sigma_2)X^2+\ldots+(S_T+S_{T-1}\sigma_1+S_{T-2}\sigma_2+\ldots+\sigma_T)X^T$$

wherein $S_i$ is an (i)th syndrome value, $\sigma_i$ is an (i)th coefficient of an error locator polynomial, i ranging from 1 to T, and T is a predetermined number, the apparatus comprising:

input means for sequentially providing the coefficients of the error locator polynomial as a first output and the syndrome values as a second output in a predetermined order;

a multiplier for sequentially multiplying the first output and the second output provided from the input means, to thereby sequentially provide multiplication results;

T memory means;

output means for providing contents of one of the T memory means in a predefined order;

an adder for adding each of the multiplication results provided from the multiplier to the contents of one of the T memory means provided from the output means, to thereby provide an addition result;

selection means for selectively providing the first output or the addition result; and means for providing the first output or the addition result provided from the selection means to one of the T memory means, to be stored therein.

2. The apparatus of claim 1, wherein the T memory means includes D flip-flops.

3. The apparatus of claim 1, wherein T is 4 and the input means includes means for providing the coefficients of the error locator polynomial in an order of $\{\sigma_1, \sigma_2, \sigma_3, \sigma_4, \sigma_0, \sigma_0, \sigma_0, \sigma_0, \sigma_1, \sigma_1, \sigma_{\sigma 1}, _2, \sigma_2, \sigma_3\}$ and providing the syndrome values in an order of $\{x, x, x, x, S_1, S_2, S_3, S_4, S_1, S_2, S_3, S_1, S_2, S_1\}$, x representing a "don't care" state.

4. An apparatus, for use in a Reed-Solomon decoder, for calculating coefficient of an error evaluator polynomial $\Omega(X)$, according to $$\Omega(X)=1+\Omega_1X+\Omega_2+X^2+\Omega_3X^3+\ldots+\Omega_TX^T=1+(S_1+\sigma_1)X+(S_2+S_1\sigma_1+\sigma_2)X^2+\ldots+(S_T+S_{T-1}\sigma_1+S_{T-2}\sigma_2+\ldots+\sigma_T)X^T$$

wherein $S_i$ is an (i)th syndrome value, $\sigma_i$ is an (i)th coefficient of an error locator polynomial, i ranging from 1 to T, and T is a predetermined number, the apparatus comprising:

input means for sequentially providing the coefficients of the error locator polynomial as a first output and the syndrome values as a second output in a predetermined order;

a multiplier for sequentially multiplying the first output and the second output provided from the input means, to thereby sequentially provide multiplication results;

first to (T)th memory means which are connected in serial;

an adder for adding each of the multiplication results provided from the multiplier to the contents of (T)th memory means, to thereby provide an addition result; and selection means for selectively providing the first output or the addition result to the first memory means.

5. The apparatus of claim 4, wherein the first to Tth memory means include D flip-flops.

6. The apparatus of claim 4, wherein T is 4 and the input means includes means for providing the coefficients of the error locator polynomial in an order of $\{\sigma_1, \sigma_2, \sigma_3, \sigma_4, \sigma_0, \sigma_0, \sigma_0, \sigma_0, \sigma_1, \sigma_1, \sigma_1, \sigma_1, \sigma_2, \sigma_2, \sigma_2, \sigma_2, \sigma_3, \sigma_3, \sigma_3, \sigma_3\}$ and providing the syndrome values in an order of $\{x, x, x, x, S_1, S_2, S_3, S_4, 0, S_1, S_2, S_3, 0, 0, S_1, S_2, 0, 0, 0, S_1\}$, x representing a "don't care" state.

* * * * *